United States Patent [19]

Chapman et al.

[11] 4,327,291

[45] Apr. 27, 1982

[54] INFRARED CHARGE INJECTION DEVICE IMAGING SYSTEM

[75] Inventors: Richard A. Chapman; Michael A. Kinch, both of Dallas; Jaroslav Hynecek, Richardson, all of Tex.

[73] Assignee: Texas Instruments Incorporated, Dallas, Tex.

[21] Appl. No.: 159,991

[22] Filed: Jun. 16, 1980

[51] Int. Cl.$^3$ ............................................. H01J 31/49
[52] U.S. Cl. ................................... 250/332; 250/349; 357/30; 358/113
[58] Field of Search ............... 250/330, 332, 338, 349; 357/29, 30; 358/113

[56] References Cited

U.S. PATENT DOCUMENTS

| | | | |
|---|---|---|---|
| 3,988,613 | 10/1976 | Brown et al. | 250/211 J |
| 4,064,533 | 12/1977 | Lampe et al. | 250/332 X |
| 4,142,925 | 3/1979 | King et al. | 250/332 X |
| 4,143,269 | 3/1979 | McCormack et al. | 250/332 X |

Primary Examiner—Davis L. Willis
Attorney, Agent, or Firm—René E. Grossman; Melvin Sharp; James T. Comfort

[57] ABSTRACT

An infrared charge transfer device (CTD) imager system is disclosed which includes an optic system, a charge transfer device detector matrix and a signal processor. The optic system focuses infrared energy from a scene onto the detector matrix. The detector matrix produces electrical signals representative of the impinging energy and the signal processor processes the electrical signals into video signals. The CTD detector matrix comprises a plurality of charge injection devices (CID). Each CID has an IR sensitive area, and two metal/insulator/semiconductor gate electrodes surrounded by a field plate. One, a column gate electrode, is centrally located within the IR sensitive area and the other, a row gate electrode, surrounds the column gate electrode. In one embodiment, the field plate and column gate electrode are in a spaced but overlapping relationship with minimum overlap, and the row gate electrode is in a spaced relationship to the field plate and column gate electrode whereby the electric field generated between the edges (corners in particular) of the field plate and column and row gate electrodes is substantially reduced. The column electrode is formed as an integral part of the column read line metallization. In a second embodiment, the column gate electrode is formed in a spaced relationship to the field plate and on the same level without overlap. However, the column read line is spaced above the column electrode and electrically connected through a via. The electric fields at the edges and corners are substantially reduced in this second embodiment.

13 Claims, 8 Drawing Figures

INFRARED CHARGE INJECTION DEVICE IMAGING SYSTEM

This invention relates to infrared imaging systems and more particularly to an infrared imaging system having a charge injection device (CID) detector matrix.

In the past, infrared imaging systems have utilized a charge injection device detector matrix. The charge injection device has two adjacent electrodes commonly referred to by the acronym MIS electrode. "M" is for the metal conductor, "I" is for the insulating layer on which the metal conductor is formed, and "S" for the semiconductor substrate on which the insulation layer is formed. The size of the metal conductor determines the area of the active area and the voltage on the metal conductor determines the depth of the potential well formed in the substrate.

Prior art designs involve a relatively thick insulator on a semiconductor with said insulator having a matrix array of small thinned recessed areas in which the CID detector elements are made. These elements form a matrix array. About one half of each thinned area is covered by a row addressed MIS with a horizontal row of MIS gates being connected by a metal line over the thick insulator thereby connecting the row-addressed MIS devices placed over the thinned insulator. The other half of each thinned area is covered by another MIS gate; these column gates are connected to a column-address line, which is a metal line running over the thick insulator connecting a column of individual MIS gates. An insulator is placed between the row-address line and the column-address line at their intersections. In this design the voltages ($V_1$) on the row and column address lines deplete the surface in the thinned insulator areas. In the thick insulator areas, the semiconductor surface can be depleted only if a larger voltage ($V_2$) is applied to the address lines. The difference ($V_2 - V_1$) = $\Delta V$ is termed the voltage margin. The voltage margin limits the well capacity of the device.

The problem of voltage margins is eliminated by the use of a field plate to cover the area between the active areas of the CID. The field plate must be the lowest level gate metal in order that the row and the column address lines will pass over this field plate to eliminate substantially the voltage margin effect. The field plate serves several useful purposes. Namely, the field plate (1) prevents the light signal creating minority carriers in the region between the detectors; and (2) provides a channel stop by permitting accumulation of the surfaces between the detecting areas thereby preventing carriers from moving from one detector to another. However, the provision of a field plate next to the MIS electrode establishes an electric field at the edge of the column-read well next to the field plate. This electric field produces an increased tunnel current at this edge.

The edge dark current is detrimental to CID operation because it partially fills the CID MIS wells and leaves less room for the light generated carriers. The net effect is that the signal and signal-to-noise ratio cannot be increased.

Accordingly, it is an object of this invention to provide an improved infrared imaging system.

Another object of the invention is to provide a CID detector matrix having substantially eliminated therefrom the effects of edge dark current.

Still another object of the invention is to provide an infrared imaging system having a CID detector matrix which is economical to manufacture and lends itself to mass production techniques.

Briefly stated, the invention comprises an infrared imaging system having an optical means for impinging infrared energy emanating from a scene onto an infrared detector matrix. The infrared detector matrix converts the impinging infrared energy into electrical signals representative of the impinging infrared energy, and a video processor processes the electrical signals into video signals. The infrared detector matrix comprises a matrix of CID elements; each fabricated with its two electrodes at different levels and the lower electrode centered with respect to a field plate and upper electrode to maximize the distance between the edges of the electrodes and the field plate to reduce substantially the electric field generated at the edge of the column-read line during operation. The corners of the electrodes are rounded to reduce concentration of the field current at the otherwise sharp corners.

Other objects and features of the invention will become more readily apparent from the following detailed description when read in conjunction with the accompanying drawings, in which like reference numerals designate like parts throughout the FIGS. thereof and in which.

Figure 1:
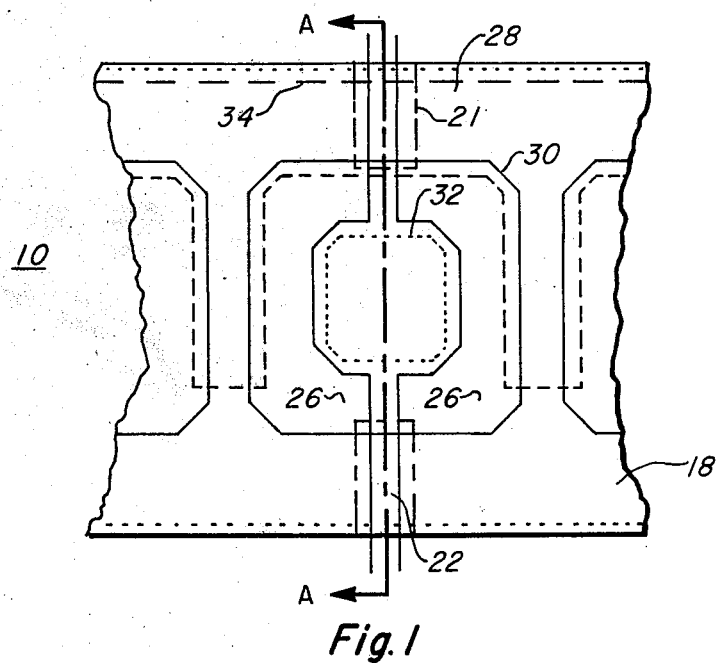
FIG. 1 is a fragmentary plan view of a first embodiment of the CID detector array.
Figure 7A:
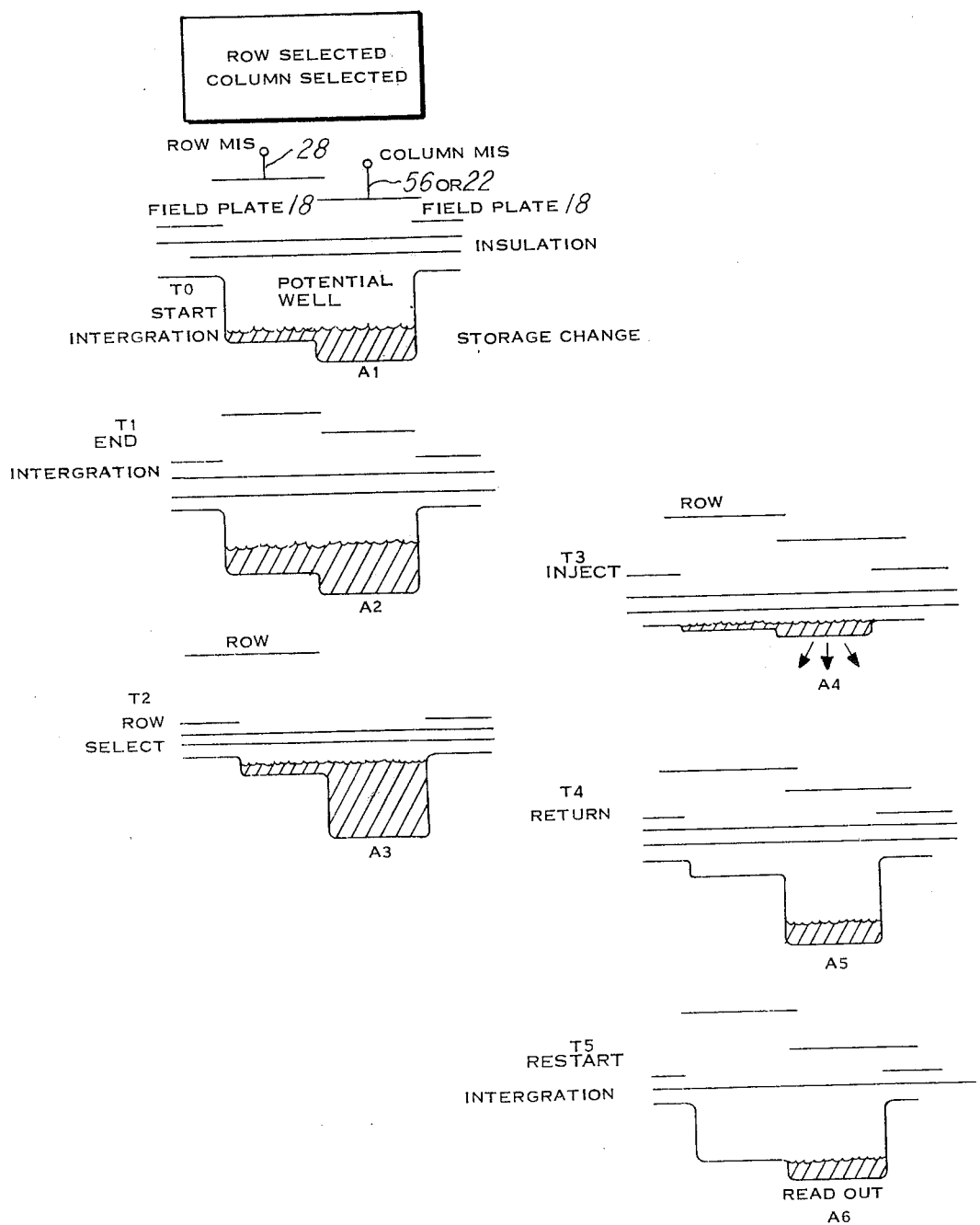

FIG. 7a1–a6 and 7b1–b6 are partial cross sectional views depicting the CID infrared action during operation.

Figure 2:
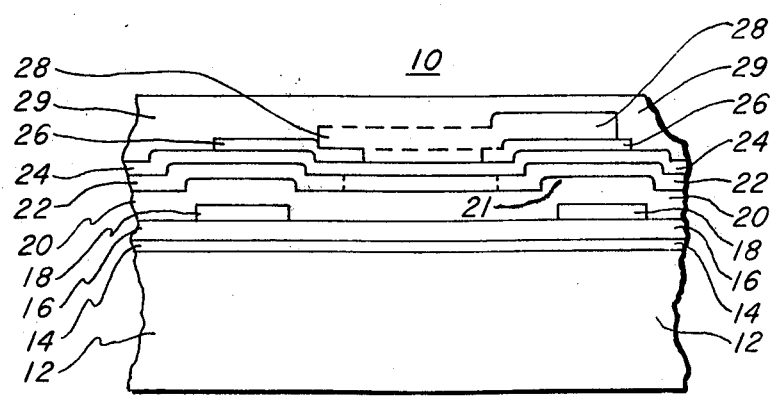
FIG. 2 is a cross sectional view taken along line A—A of FIG. 1.

Referring now to FIGS. 1 and 2, each element 10 of the first embodiment of the CID detector array comprises a substrate 12 (FIG. 2) of semiconductor material of either "p" or "n" type conductivity. The semiconductor material may be, for example, a silicon substrate or a mercury/cadmium/telluride (Hd,Cd,Te) substrate. The material selected is that suitabled for detecting a desired infrared bandwidth. HgCdTe of "n" type conductivity is preferred for the 3–5 micron and 8–14 micron wavelengths. A native oxide layer of 14 of about 500 Å thickness is formed on a surface of the substrate 12. Next, a layer 16 of insulating material such as, for example, ZnS is thermally evaporated on the native oxide layer. The layer of ZnS is about 500–1500 Å thick. Next an opaque metal field plate 18 is formed using the photolithographic lift process in which the ZnS layer is selectively masked to form the desired field plate pattern and aluminum or nickel deposited thereon to form a conductor having a thickness of between about 200 A to 1500 Å. Next, the field plate and the field plate bearing insulating layer are covered with a second insulating layer 20 of, for example, ZnS. Insulating layer 20 is thermally deposited to a thickness of about 300 A–2000 Å, and has an increased thickness 21 over the field plate 18 for a purpose hereinafter explained. Next, insulating layer 20 is masked and a thick (about 1000 Å) layer 22 of metal, preferably aluminum, is deposited and patterned using the photolithographic lift process. This metal pattern forms the column (first level) electrode. Next, a third layer 24 of insulating material (ZnS) is thermally evaporated over the column electrode 22 and column electrode bearing insulating layer 20. Next, the third insulating layer 24 is masked and a thin transparent metal layer 26 is deposited and patterned using the photolithographic lift process on the third insulation layer 24. This transparent metal electrode, which is preferably nickel, has a thickness of about 150 Å, and forms the IR sensitive region. Then an opaque highly conductive row address metal 28 is patterned on the thin transparent metal layer 26 using the photolithographic lift process. The row address metal conductor has a thickness of about 1000 Å. Finally a ZnS insulator layer 29, having a thickness of about 4500 Å, is formed over the row 15 address metal conductor. The extra thickness 21 of insulating layer 20 is to increase the distance between the field plate 18 and column electrode to reduce substantially the electric field in the semiconductor underneath the field plate edge.

As shown in FIG. 1, the edge 30 of the field plate 18 (shown in solid lines) defines the outer boundary of the aperture in the field plate. While the edge 32 defines the opening in the transparent row metal electrode (shown in dotted lines). The opaque row address metal pattern 28 is defined by dashed lines 34, and the increased thicknesses 21 of insulating layer 20 are shown in dash-dot lines.

Figure 3:
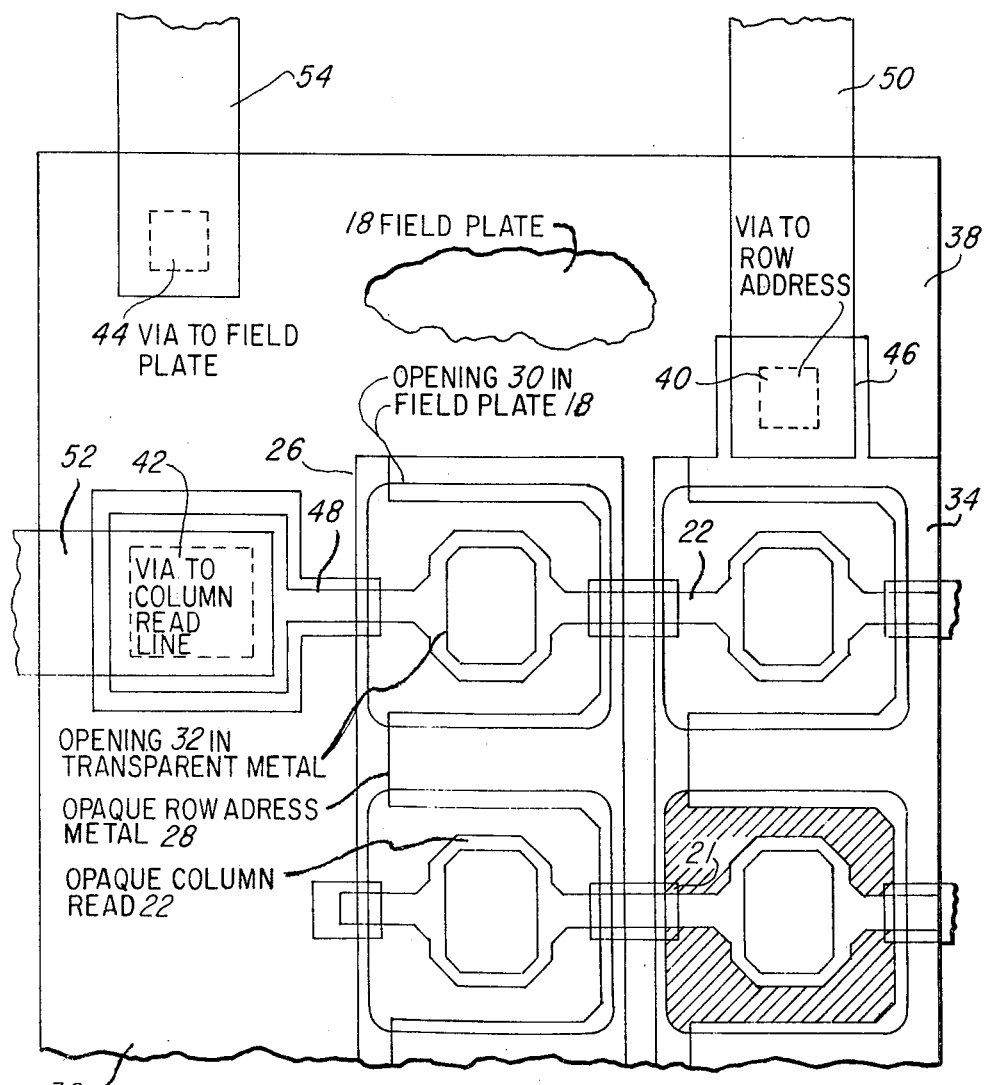
FIG. 3 is a plan view of the first embodiment of a CID detector array.

A typical CID detector matrix comprises a 32×32 detector element array arranged in rows and columns and a surrounding border. However, for purposes of description and clarity only a 2×2 element portion and border is shown in FIG. 3. As shown in FIG. 3, the border 38 has vias 40, 42, and 44 formed therein. Via 40 passes through the insulating layer 29 (FIG. 2) to the tab 46 (FIG. 3) of the row address 28, and via 42 passes through insulating layer 29 and 24 (FIG. 2) to the tab 48 of column read line 22. While via 44 passes through insulators 29, 24 and 20 to field plate 18.

Vias 40, 42, and 44 are filled by thick bonding metal conductors 50, 52, and 54, preferably of a soft metal such as indium, which create electrical contact with the row address electrodes, column read lines and field plate. The row address and column read lines have connecting tabs at every other end to conserve space.

The infrared sensitive are of one of the four elements is shown by the hatched area in the lower right hand corner of FIG. 3. This area is defined by the area inside the field plate aperture 30 as diminished by the overlapping, opaque row metal 34 and outside the edge of the opaque column metal 22 as shown in FIG. 1.

In a second embodiment (FIGS. 4 and 5), each detector element 10 comprises the HqCdTe substrate 12 (FIG. 5), native oxide layer 14 and ZnS insulator 16 formed as described for the first embodiment. On the ZnS insulator layer 16, a metal layer is patterend by the photolithographic lift process to form both the field plate 18, and column gate electrode 56 as the first level metalization. This arrangement eliminates the overlap between the field plate and column gate. A ZnS insulating layer 60, having a thickness of about 2500 Å, covers the first level metalization. Insulator 60 is masked and metalized to form first the transparent row metal 62 and then the opaque row address line 76 using the photolithographic lift process. The transparent row metal 62 and row address line 76 are covered by a ZnS insulating layer 64. Insulator layer 64 has a thickness about 4000 Å. A via 68 is formed by etching away insulator 64 and insulator 60 to column gate 56. Insulator 64 is then patterned and metalized, for example, with aluminum using the photographic lift process to form a column line 66. The via is then filled with a thick metal such as, for example, indium 70.

Figure 4:
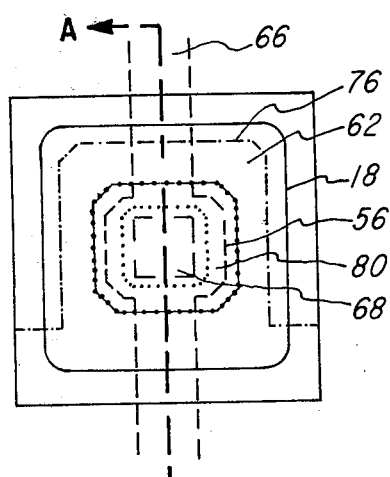
FIG. 4 is a fragmentary plan view of a second embodiment of the CID detector array.

Thus, as shown in FIG. 4, the column well gate or electrode 56 (dotted-plus-solid line) is within the field plate 18 (solid line). The IR sensitive area is that portion of the transparent row metal 62 which is outside the union of the column well gate metal 56, the field plate 18, and the opaque row address metal 76. The via 68 (dashed lines) interconnects the column well gate and the metal column read line 66 (dashed lines). The dotted line just outside the via is the opening 80 in the transparent row metal. The row address line 76 overlaps the insulator step caused by the edge 80 of the field plate 18 (dash and dot line and connecting solid line).

Figure 5:
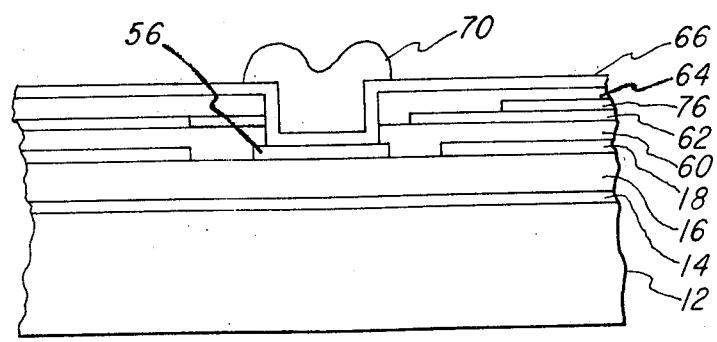
FIG. 5 is a cross sectional view taken along line A—A of FIG. 4.
Figure 6:
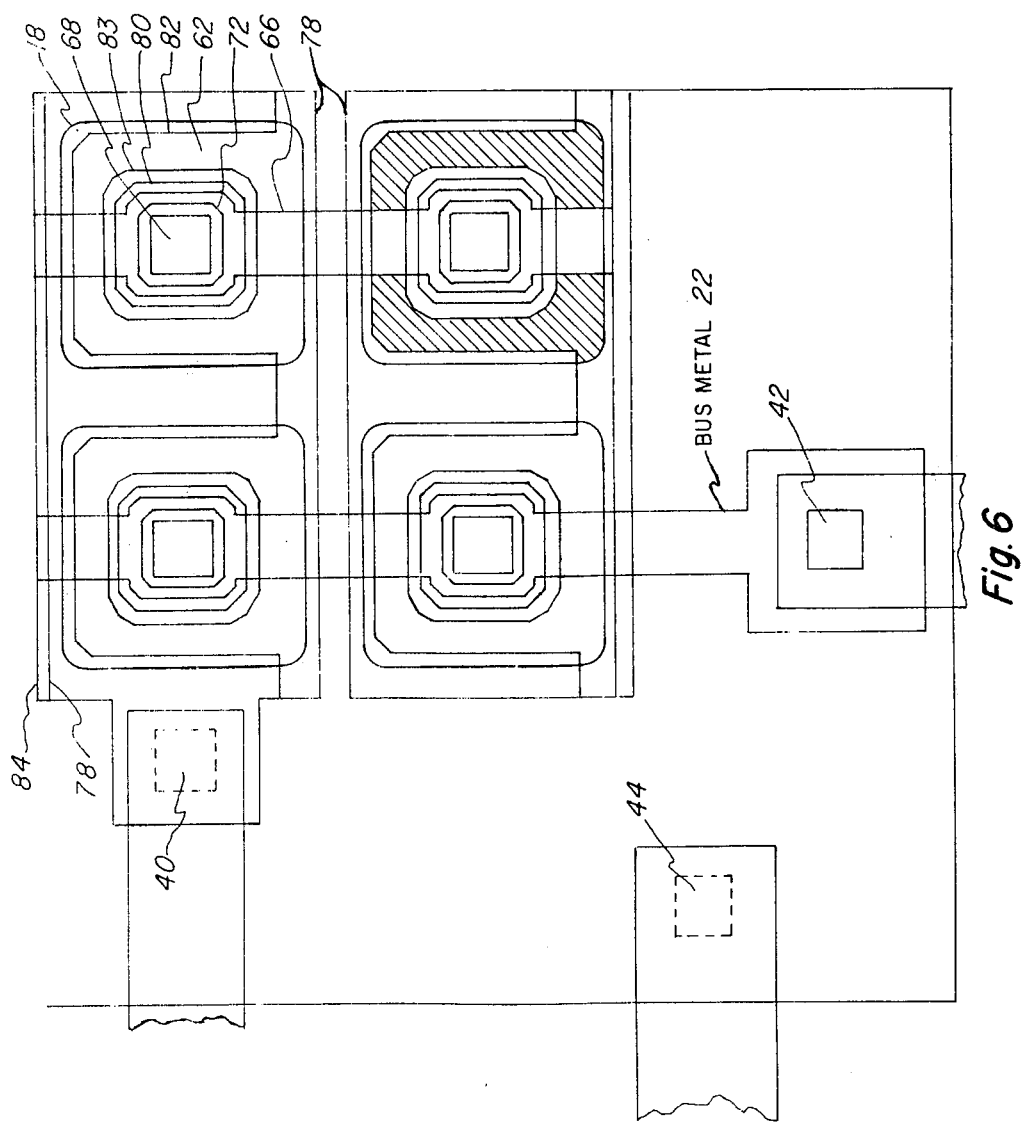
FIG. 6 is a plan view of the second embodiment of the CID detector array.

The detector array of the second embodiment (FIG. 6) is similar to that of FIG. 3. The difference is that the via 68 for each cell brings down the column read line to each column gate; this eliminates the overlap of the first level column well with the field plate 18. Thus, the via arrangement eliminates the need for the field plate protect 21 of the first embodiment. The outer limit 78 of the thin transparent metal 62 and the opening 80 in the thin metal defines the area of thin metal for each element. The column MIS storage area 83 is the column gate 56 (FIGS. 4 and 5). Each detector has two infrared sensitive areas defined as the area outside the union of the column gate 56, the opaque row line 76 (FIG. 4), and the column read line 66. The inner limit 82 of the thick row metal and the outer limit 84 defines the row address lines 76 for the elements. The hatched lines in the lower right hand cell in FIG. 6 illustrate the infrared sensitive area.

Figure 7B:
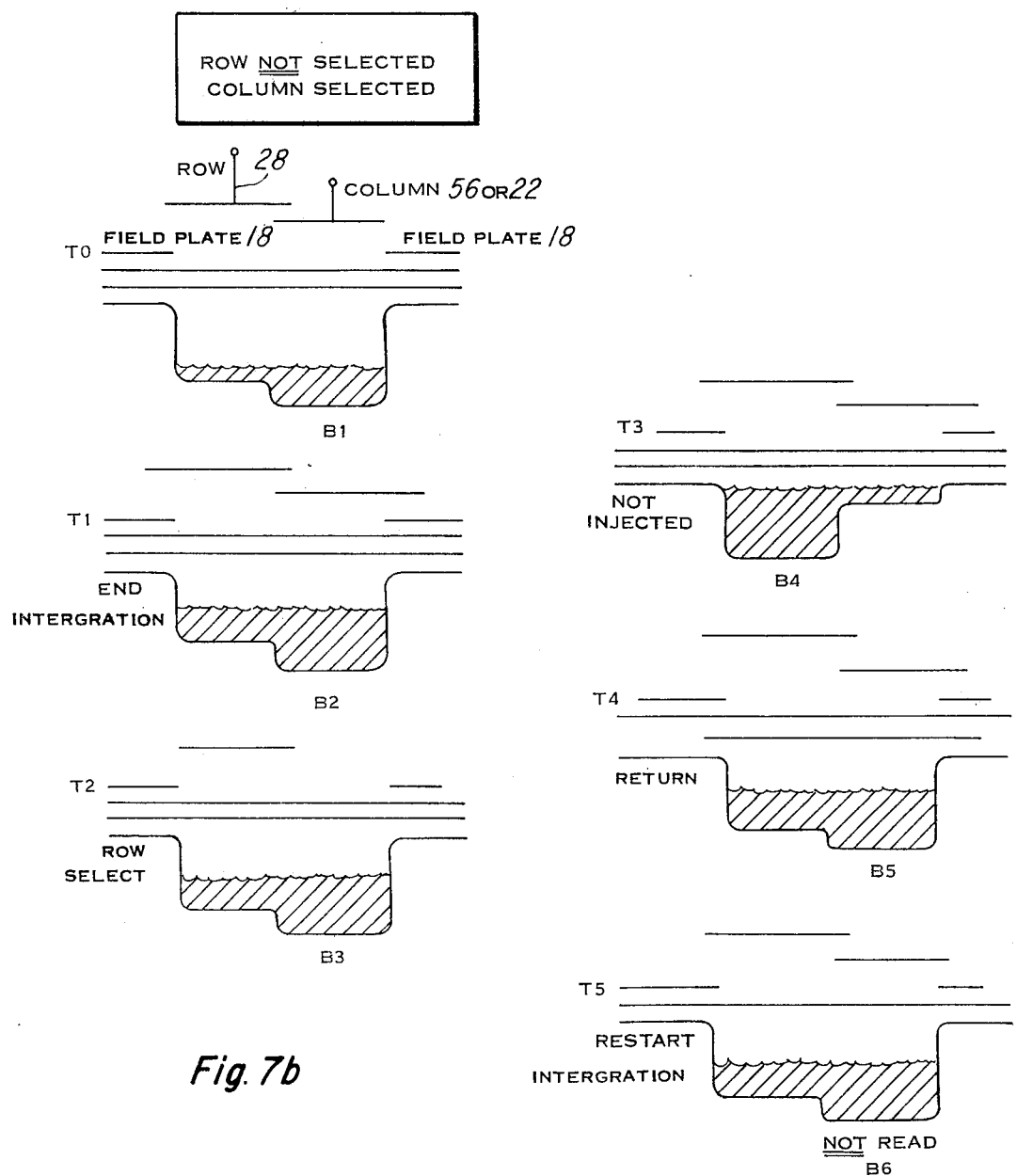

Referring now to FIGS. 7a1–a6 and 7b1–b6, as both embodiments operate in the same manner only one need be described. At start up, the field plate 18 (FIG. 5) is biased with the minimum necessary voltage V−1 to accumulate the semiconductor surface and prevent the surface collection of charges in the areas surrounding each detector element. Next for an n-type semiconductor, integrations are started with the application of negative voltages to column gates 56 and row gates 28 to form adjacent wells in the substrate (FIGS. 7a1–b1). At time $t_1$, integration is completed with the wells partially filled (FIGS. 7a2–b2). At time $t_2$ the selected rows are turned off. With the voltage to the selected row of gates off the row wells collapse transferring their charges to the column wells (FIG. 7a-3). The voltages applied to the non-selected rows remain on and the wells and their charges remain intact (FIG. 7b-3). The voltages of the column electrodes (FIG. 7a-3) are preset to the desired voltage and the column read line floated between $t_2$ and $t_4$ and the measured column voltages are sampled using correlated double sampling circuits (not shown). At time $t_3$ a positive-going injection pulse is applied through a capacitor to the floating column line to collapse the potential wells underneath the column electrodes. In the non-selected rows, the column wells collapse and the charge is transferred into the row potential wells (FIG. 7b-4); while in the selected row, the column wells collapse dumping the charge into the substrate. At time $t_4$ the injection pulse is terminated and the negative gate voltages reappear on the floating column lines, reestablishing the column potential wells. These negative voltages are changed if charge has been injected at the selected cell. In the non-selected row, the column well is reestablished and the charge in the row well redistributes itself within the row and column wells (FIG. 7b-5) resulting in no change in the voltage of the floating column line. After $t_4$, the voltages are sampled a second time by the correlated double sampling circuits and the difference between the first and second sample voltages is proportional to the infrared energy impinging on the selected element. These signals are amplified and processed by a processor, not shown, into video signals for display. Finally, at $t_5$, the row gate is turned on and the row and column wells are reestablished (FIGS. 7a-6 and b6) for the start integration step of a new cycle.

Although the detector matrix fabrication processes, the multiplexer, the correlated double sampling circuits (also called clamp, sample and hold circuits), and the signal processing circuitry, not shown, are well known in the art, those persons skilled in the art requiring detailed description thereof are referred to U.S. Patent application, Ser. No. 950,191; filed: Oct. 10, 1978, for a "Narrow Bandgap Semiconductor CCD Imaging Device and Method of Fabrication" now U.S. Pat. No. 4,231,149, issued Nov. 4, 1980, as well as U.S. Pat. No. 3,935,446 entitled "Apparatus for Sensing Radiation and Providing Electrical Readout".

Although several embodiments of this invention have been described herein, it will be apparent to a person skilled in the art that various modifications to the details of construction shown and described may be made without departing from the scope of this invention.

What is claimed is:

1. An infrared imager system comprising:
   (a) means for focusing infrared energy emanating from a scene;
   (b) an infrared detector matrix in the path of the focused infrared energy for converting the infrared energy into electrical signals, said detector matrix having a plurality of charge injection device (CID's) detector elements, each charge injection device detector element having a substrate of semiconductor material, a plurality of electrodes supported by said substrate, said plurality of electrodes including a first non-uniform width electrode centrally disposed as to a second electrode to substantially reduce dark current, said electrodes operative to store charges generated by the infrared energy impinging on the CID element, said charges producing changes in voltages representative of impinging infrared energy; and
   (c) means for producing video signals from the voltage changes representative of the impinging infrared energy.

2. An infrared imaging system according to claim 1 wherein each of said CID's of the infrared detector matrix further include a field plate and biasing means for biasing the field plate to create a channel stop which isolates adjoining elements from one another.

3. An infrared imager system according to claim 2 wherein the substrate of semiconductor material has a first layer of insulating material said first layer of insulating material bearing the field plate of each CID.

4. An infrared imager system according to claim 3 wherein the CID detector element further includes a second insulating layer, and a column gate and column gate read line metalization mounted upon the second insulating layer, said column gate, first and second insulating layers and substrate forming the column gate electrode.

5. An infrared imager system according to claim 4 wherein the second layer insulator further includes an increased thickness portion above the field plate.

6. An infrared imager system according to claim 4 or 5 wherein the CID detector element further includes a third insulating later, and a metal layer region forming a second or row electrode, said metal layer region being transparent to IR energy, and a row address line.

7. An infrared imager system according to claim 3 further including a column gate mounted on the first layer of insulating material in a spaced relationship to the field plate formed on the first layer of insulating material.

8. An infrared imager system according to claim 7 further including a second insulating layer covering the field plate and column gate, and a transparent region and row address metalization on the second layer of insulation.

9. An infrared imager system according to claim 8 further including a third insulating layer for covering the transparent region metal, a column read line metalization on said third insulating layer, and a via interconnecting the column gate and column read line.

10. An infrared imager system according to claim 1 wherein said first non-uniform width electrode has its maximum width over the center of the detector element.

11. An infrared imager system comprising:
   (a) means for focusing infrared energy emanating from a scene;
   (b) an infrared detector matrix for receiving the focused infrared energy and generating electrical signals in response to the intensity thereof said detector matrix comprising a plurality of CID detector elements having a common substrate of semiconductor material of preselected conductivity type, said substrate having a native oxide layer, a first insulating layer on the native oxide layer, an apertured field plate metalization on the first insulating layer, the apertures of said apertured field plate defining the location of each of the plurality of CID detector elements, the edges of the field plate forming polygonal apertures having blunted corners, and column gates mounted in a spaced relationship with the field plate, said column gate having a polygonal shape and blunted corners corresponding to the shape of the field plate apertures whereby the electrical fields found at the corners are reduced substantially; and
   (c) a signal processor for processing the electrical signals of the infrared detector matrix into video signals.

12. An imager system comprising:
   (a) means for focusing light energy emanating from a scene;
   (b) a detector matrix for receiving the focused light energy and generating electrical signals in response to the intensity thereof said detector matrix comprising a plurality of CID detector elements having a common substrate of semiconductor material of preselected conductivity type, a first layer of insulating material on the substrate, an apertured field plate on the first layer of insulating material, a second layer of insulating material on the apertured field plate, column electrodes and column read lines on the second layer of insulating material, said column electrodes being centrally located with respect to the apertures of the apertured field plate and said column read lines substantially reduced in width with respect to the column electrode whereby any dark current resulting from the electric field generated between the field plate and column electrodes, and the field plate and column read lines are substantially reduced; and (c) means connected to the detector matrix for producing video signals from the electrical outputs of the detector matrix.

13. An imager system comprising:
(a) means for focusing light energy emanating from a scene;
(b) a detector matrix for receiving the focused light energy and generating electrical signals in response to the intensity thereof, said detector matrix having a plurality of CID detector elements having a common substrate of semiconductor material of preselected conductivity type, a first layer of insulating material on the substrate, an apertured field plate on the first layer of insulating material, column electrodes centrally disposed within the aperture of the apertured field plate, a second layer of insulating material on the apertured field plate, vias formed in the second layer of insulating material to the column electrodes and column read lines on the second layer of insulating material and contacting the column electrodes through the vias whereby any electrical fields between the apertured field plate and column electrodes and between the apertured field plate and column read lines are substantially reduced; and
(c) means connected to the detector matrix for producing video signals from the electrical outputs of the detector matrix.

* * * * *